US010372575B1

(12) United States Patent
North et al.

(10) Patent No.: US 10,372,575 B1
(45) Date of Patent: Aug. 6, 2019

(54) SYSTEMS AND METHODS FOR DETECTING AND REMOVING ACCUMULATED DEBRIS FROM A COOLING AIR PATH WITHIN AN INFORMATION HANDLING SYSTEM CHASSIS ENCLOSURE

(71) Applicant: DELL PRODUCTS L.P., Round Rock, TX (US)

(72) Inventors: Travis C. North, Cedar Park, TX (US); Karunakar P. Reddy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/884,972

(22) Filed: Jan. 31, 2018

(51) Int. Cl.
*G06F 11/273* (2006.01)
*H05K 7/20* (2006.01)

(52) U.S. Cl.
CPC ..... *G06F 11/2736* (2013.01); *H05K 7/20209* (2013.01); *H05K 7/20909* (2013.01); *H05K 7/20136* (2013.01); *H05K 7/20745* (2013.01)

(58) Field of Classification Search
CPC ........... H05K 7/20209; H05K 7/20727; H05K 7/20909; H05K 7/20718; H05K 7/20836; H05K 7/20136; H05K 7/20554–7/20581; H05K 7/20736; G06F 1/20; G06F 1/206; G06F 1/203; G06F 11/3058; F24F 11/77; F24F 11/0001; F24F 11/63; F24F 11/65; F24F 2203/052; G11B 33/142; G11B 33/1486; Y02D 10/16
USPC ..................... 361/695, 692, 679.48; 700/280
See application file for complete search history.

(56) References Cited

U.S. PATENT DOCUMENTS

| | | | | |
|---|---|---|---|---|
| 6,082,623 | A | 7/2000 | Chang | |
| 6,760,649 | B2 | 7/2004 | Cohen | |
| 7,826,216 | B2 * | 11/2010 | Moss | H05K 7/20736 361/679.48 |
| 8,046,896 | B2 * | 11/2011 | Schmitt | G06F 1/20 165/104.33 |
| 8,634,192 | B2 * | 1/2014 | Hoss | G06F 1/20 361/694 |
| 8,909,384 | B1 | 12/2014 | Beitelmal et al. | |
| 9,155,229 | B2 * | 10/2015 | Schmitt | H05K 7/20745 |
| 9,335,802 | B2 * | 5/2016 | Shelnutt | G06F 1/206 |
| 10,039,207 | B2 * | 7/2018 | Schmitt | H05K 7/1497 |

(Continued)

OTHER PUBLICATIONS

North et al., Apparatus and Methods for Characterizing a Heat Pipe and For Controlling an Operating Parameter of at Least One Heat Generating Component Coupled to The Heat Pipe, U.S. Appl. No. 15/585,509, filed May 3, 2017, 38 pgs.

(Continued)

*Primary Examiner* — Dion Ferguson
*Assistant Examiner* — Amir A Jalali
(74) *Attorney, Agent, or Firm* — Egan Peterman Enders Huston

(57) ABSTRACT

Systems and methods are provided that may be implemented to detect impaired flow of cooling air within a chassis enclosure of an information handling system during system operation, and to implement a diagnostic or system boot mode to reverse direction of cooling air flow through the chassis enclosure after such detection of impeded cooling air flow so as to remove any dust or other accumulated debris that is causing the impeded cooling air flow.

20 Claims, 7 Drawing Sheets

(56) References Cited

U.S. PATENT DOCUMENTS

| | | | | |
|---|---|---|---|---|
| 2011/0235272 | A1* | 9/2011 | Bash | H05K 7/20609 361/692 |
| 2012/0026677 | A1* | 2/2012 | Bhutani | F04D 25/0613 361/679.48 |
| 2014/0160657 | A1 | 6/2014 | Morrison et al. | |
| 2016/0091938 | A1 | 3/2016 | Edwards et al. | |
| 2017/0374760 | A1 | 12/2017 | Chen | |

OTHER PUBLICATIONS

Hu et al., "Systems and Methods for Interconnecting and Cooling Multiple Graphics Processing Unit (GPU) Cards", U.S. Appl. No. 15/802,054, filed Nov. 2, 2017, 37 pgs.

Ho, "Understanding Intel's Dynamic Power and Thermal Framework 8.1: Smarter Throttling", Aug. 2015, 4 pgs.

INEMO Inertial Module: 3D Accelerometer and 3D Gyroscope, Life.Augmented, LSM330DLC, 2017, 4 pgs.

Goodrich, "Accelerometer vs. Gyroscope: What's The Difference? ", LiveScience, Oct. 2013, 3 pgs.

North et al., "Systems and Methods for Detecting Impeded Cooling Air Flow for Information Handling System Chassis Enclosures" U.S. Appl. No. 15/885,054, filed Jan. 31, 2018, 53 pgs.

North et al., "Systems and Methods for Detecting Impeded Cooling Air Flow for Information Handling System Chassis Enclosures", U.S. Appl. No. 15/885,054, filed Jan. 31, 2018, Office Action dated Jan. 8, 2019, 38 pgs.

North et al., "Systems and Methods for Detecting Impeded Cooling Air Flow for Information Handling System Chassis Enclosures", U.S. Appl. No. 15/885,054, Response to Office Action filed Apr. 8, 2019, DELL:227; 17 pgs.

* cited by examiner

SYSTEMS AND METHODS FOR DETECTING AND REMOVING ACCUMULATED DEBRIS FROM A COOLING AIR PATH WITHIN AN INFORMATION HANDLING SYSTEM CHASSIS ENCLOSURE

RELATED APPLICATIONS

The present application is related in subject matter to concurrently filed patent application Ser. No. 15/885,054 entitled "SYSTEMS AND METHODS FOR DETECTING IMPEDED COOLING AIR FLOW FOR INFORMATION HANDLING SYSTEM CHASSIS ENCLOSURES" by North et al., which is incorporated herein by reference in its entirety for all purposes.

FIELD

This invention relates generally to information handling systems and, more particularly, to cooling air flow within chassis enclosures of information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The majority of current laptop and desktop computer systems utilize cooling fans inside a chassis enclosure to cool the system components such as system chipset contained inside the chassis enclosure. Such cooling fans draw-in cool air and push out heat generated by system components using a network of heatsink, fin stack and heat pipe mechanisms. The cooler air is pulled into the chassis enclosure by the cooling fans via a series of air inlets and is exhausted from the chassis enclosure by a series of air outlets. The design of these air inlets and outlets is typically determined based on thermal simulation, industrial design and the allowed mechanical limits for openings defined in the structure of the chassis enclosure. Perforations are defined in the chassis enclosure to act as the air inlets and outlets, and these perforations tend to collect dust over a period of time with cumulative air flow. This collected dust adversely effects the thermal performance of the system components within the chassis enclosure, and causes user dissatisfaction. For example, due to notebook computer architecture and component placement, the air inlet is typically defined in the bottom of the notebook system where there is a greater probability that the fan will ingest dirt, lint and other debris that over time tend to clog the thermal heat sink and/or other system components, leading to reduced thermal efficiency of the system. When this occurs, higher system temperatures result which leads to frequent activation of over temperature protection (OTP).

Information handling systems and other devices often utilize blower apparatus or cooling fans to regulate temperature generated within a chassis of the device. For example, notebook computers and similar devices often employ a blower to cool the system chipset together with other heat sources that may be present within the chassis. Due to notebook computer architecture and component placement, the blower inlet is typically defined in the bottom of the system where there is a greater probability that the blower fan will ingest dirt, lint and other impurities that over time tend to clog the thermal heat sink and/or other system components, leading to reduced thermal efficiency of the system. When this occurs, higher system temperatures result which leads to frequent activation of over temperature protection (OTP). Conventional solutions for removing collected dust typically employ physical (mechanical) dust removal techniques. Prototype fans exist that utilize a separate air channel to exhaust dust out a secondary air path when reversing the fan at system boot as described in United States Patent Application Publication Number 20120026677.

It is known to provide a personal computer with an internal altimeter that senses the altitude to which the personal computer is exposed to allow the personal computer to display the sensed altitude to a user of the personal computer.

SUMMARY

Disclosed herein are systems and methods that may be implemented to intelligently detect impeded flow of cooling air within a chassis enclosure of an information handling system based on sensed air pressure within the cooling air flow in the chassis enclosure, and to take further action to warn of such an impeded air flow condition and/or to remedy the cause of the impeded air flow condition. Detected impeded cooling air flow may be caused by a number of conditions, such as partial or complete blockage of an air flow path through a chassis enclosure (e.g., due to accumulation of dust or other debris in one or more structure/s disposed in the air flow path such as cooling air inlets, cooling air outlets, cooling fin stacks, etc.), external blocking of cooling air inlet and/or outlet (e.g., such as cooling air inlet blocked by a pillow or other object) or other catastrophic air flow condition (e.g., such as cooling fan failure) that causes over-heating and reduced system performance, etc. In one embodiment, the disclosed systems and methods may be advantageously implemented to actively determine such impeded air flow conditions based on sensed real time air pressure across the cooling fan/s of the system.

In a further embodiment, the disclosed systems and methods may be implemented to reverse direction of cooling air flow through the chassis enclosure when sensed air pressure within the chassis enclosure (e.g., measured across the cooling fan/s) indicates impeded cooling air flow so as to remove any dust or other accumulated debris that is causing the impeded cooling air flow. In such an embodiment, cooling fan operation may be intelligently managed to make an information handling resistant to debris accumulation and overheating caused by accumulated debris. Advantages that may be achieved by intelligent cooling fan management include, but are not limited to, improving system user experience by reducing system component failures and/or poor system performance due to overheating, avoiding exposure of a user to high external chassis enclosure temperatures (e.g., high laptop or notebook external chassis skin temperature, TsKIN), and reducing high acoustic noise produced by system cooling fans. Such advantages may further result in reduced service calls and poor user satisfaction issues.

In one embodiment, impaired cooling air flow within a chassis enclosure may be dynamically detected during system operation based on a value of cooling air flow pressure that is measured in real time at one or more locations within a chassis enclosure. In this regard, air flow pressure may be sensed using pressure sensor/s (e.g., such as a barometric air pressure sensor) positioned at one or more locations in a cooling air flow path within an information handling system chassis enclosure. In such an embodiment, an impeded cooling air flow condition may be detected when the sensed air flow pressure meets or exceeds an absolute pressure threshold value (e.g., a critical absolute pressure threshold value) that is predefined to correspond to reduced air flow conditions at the location of a given pressure sensor, e.g., relative to a lower system operating absolute pressure point that exists under normal non-impeded cooling air flow conditions within the information handling system chassis. In one embodiment, a critical absolute pressure threshold value may be determined based on empirical measurement of impeded flow conditions at the location of the given sensor within the chassis. The disclosed systems and methods may be further configured to automatically sense the cooling air flow absolute pressure and to take an action based upon the operating absolute pressure of the system, e.g., upon detection of a cooling air flow operating absolute pressure value that exceeds the normal system operating absolute pressure point. Examples of such actions including warning the user with an alert indication (e.g., with a displayed error message alert, audible alert, etc.) of impeded cooling air flow and/or reversing the cooling air flow direction to dislodge dust or other debris from coolant thermal perforations and/or other structures (e.g., such as heatsink fins) in the cooling air flow path.

Additional embodiments are possible, e.g., different critical absolute pressure threshold values may be predefined that correlate to different fan speeds (e.g., such as in five fan speed steps: Fan off, fan low, fan medium, fan medium high, and fan high). For example, in one embodiment a look up table may be stored in system non-volatile memory and may include different critical absolute pressure threshold values that are defined for each corresponding different fan speed step. In another embodiment, the real time absolute pressure difference (AP) between the sensed pressure of multiple different pressure sensors positioned at respective multiple different locations in the internal chassis air flow path may be used to determine existence of an impeded cooling air flow condition. In such an alternate embodiment, the monitored absolute pressure difference (AP) sensed along the airflow path may be compared to a pre-defined critical absolute (APc) value to determine existence of an impeded cooling air flow condition.

For example, a first pressure sensor may be positioned near a first chassis cooling air inlet and a second pressure sensor may be positioned near the suction point of a cooling fan (i.e., between the first pressure sensor and the fan suction point), and an absolute pressure difference (ΔP) between the sensed pressure at these two airflow path positions may be calculated and monitored. Other pressure sensors may be optionally positioned near one or more other cooling air inlets in position between the second pressure sensor and a respective cooling air inlet. In such an alternate embodiment, the monitored absolute ΔP between the second pressure sensor and each of the other pressure sensors may be sensed along the airflow path, and compared to a pre-defined critical absolute (ΔPc) value to determine existence and location of an impeded cooling air flow condition. In the above example, blockage of the first air inlet may be identified when the pre-defined critical absolute ΔPc value is met or exceeded by the real time measured critical absolute pressure difference (ΔP) between pressure sensed by the first pressure sensor at the first cooling air inlet and pressure sensed by the second pressure sensor at the fan suction. At the same time, sensed real time pressure at unblocked cooling air inlets will not exceed the pre-defined critical absolute ΔP value, and thus location of impaired air flow at the first cooling air inlet may be determined. A similar analysis may be performed to identify and locate a blocked air outlet among multiple air outlets, etc.

In a further embodiment, a diagnostic mode may be implemented to temporarily reverse the direction of cooling air flow within the chassis (e.g., by reversing the direction of cooling fan rotation) to cause removal of any accumulated dust or other debris (e.g., from cooling inlets, cooling outlets, heatsink fins, etc.) whenever such an impeded cooling air flow condition is dynamically detected within the chassis enclosure. Such a diagnostic mode may be automatically entered at the next system warm boot (e.g., OS re-boot or restart without power down) and/or system power down followed by system cold boot when impeded air flow has been previously detected during the most recent system OS operating session, or may be made available only to a service technician (e.g., who enters a proper service password) as part of a special diagnostic routine that is run by the technician after impeded cooling air flow has been detected during normal system operation. In yet a further embodiment, a message (e.g., error message) may be automatically generated and displayed to a system user during system operation when impeded air flow has been detected within the chassis enclosure in order to make the user aware of the impeded air flow condition. In such an embodiment, the user may respond to the message by restarting or otherwise rebooting the operating system of the information handling system to cause the cooling air flow direction to be temporarily reversed for cleaning purposes. In an alternative embodiment, the diagnostic mode may give the user the option to choose whether or not to temporarily reverse the cooling air flow direction during the operating system reboot.

In another embodiment, a separate diagnostic program may be provided that may be initiated and run on the system by a service technician in the field after catastrophic failure of the system, e.g., such as upon occurrence of an emergency system shutdown due to information handling system overheating. Such a diagnostic program may access a saved event log stored on the system that includes any history of impeded air flow detection events that have occurred during previous system operating session/s, and to automatically reverse the direction of cooling air flow within the chassis (e.g., by reversing the direction of cooling fan rotation) to cause removal of any accumulated dust or other debris (e.g., from cooling inlets, cooling outlets, heatsink fins, etc.) whenever such a history of impeded cooling air flow condition is found to be stored. In an alternative embodiment, such a diagnostic program may allow the technician to decide whether to proceed with reversed cooling air flow operation, and/or to perform system component diagnostics, based on the history of impeded events which may be displayed to the technician.

In one respect, discloses is an information handling system, including: a chassis enclosure having at least one inlet defined in the chassis enclosure and at least one outlet defined in the chassis enclosure; at least one heat-generating component disposed within the chassis enclosure; at least one cooling fan disposed within the chassis enclosure, the cooling fan configured to draw in air from outside the chassis enclosure through the inlet into the interior of the chassis enclosure to move the air in a first direction through a first air flow path within the chassis enclosure to cool the heat-generating component and to expel the air from the interior of the chassis enclosure through the outlet, and to selectably draw in air from outside the chassis enclosure through the outlet into the interior of the chassis enclosure to move the air in a second direction through a second air flow path within the chassis enclosure to expel the cooling air from the interior of the chassis enclosure through the inlet; at least one pressure sensor disposed within the first air flow path within the chassis enclosure; and at least one processing device coupled to the pressure sensor to monitor the real time air pressure within the first air flow path and coupled to the cooling fan to selectably control an operation of the cooling fan to change the direction the cooling fan moves the air through the chassis enclosure from the first direction to the second direction based on the monitored air pressure within the first air flow path.

In another respect, disclosed herein is a method including: controlling at least one cooling fan disposed within a chassis enclosure of an information handling system to draw in air from outside the chassis enclosure through at least one inlet defined in the chassis enclosure into the interior of the chassis enclosure to move the air in a first direction through a first air flow path within the chassis enclosure to cool at least one heat-generating component within the chassis enclosure and to expel the air from the interior of the chassis enclosure through at least one outlet defined in the chassis enclosure; monitoring real time air pressure within the first air flow path while the cooling fan is moving the air in the first direction through the first air flow path within the chassis enclosure; and controlling the at least one cooling fan based on the monitored air pressure within the first air flow path to change the direction that air moves though the chassis enclosure from the first direction to a different and second direction so as to draw in air from outside the chassis enclosure through the outlet into the interior of the chassis enclosure and move the air in a second direction through a second air flow path within the chassis enclosure to expel the cooling air from the interior of the chassis enclosure through the inlet.

DESCRIPTION OF ILLUSTRATIVE EMBODIMENTS

Figure 1A:
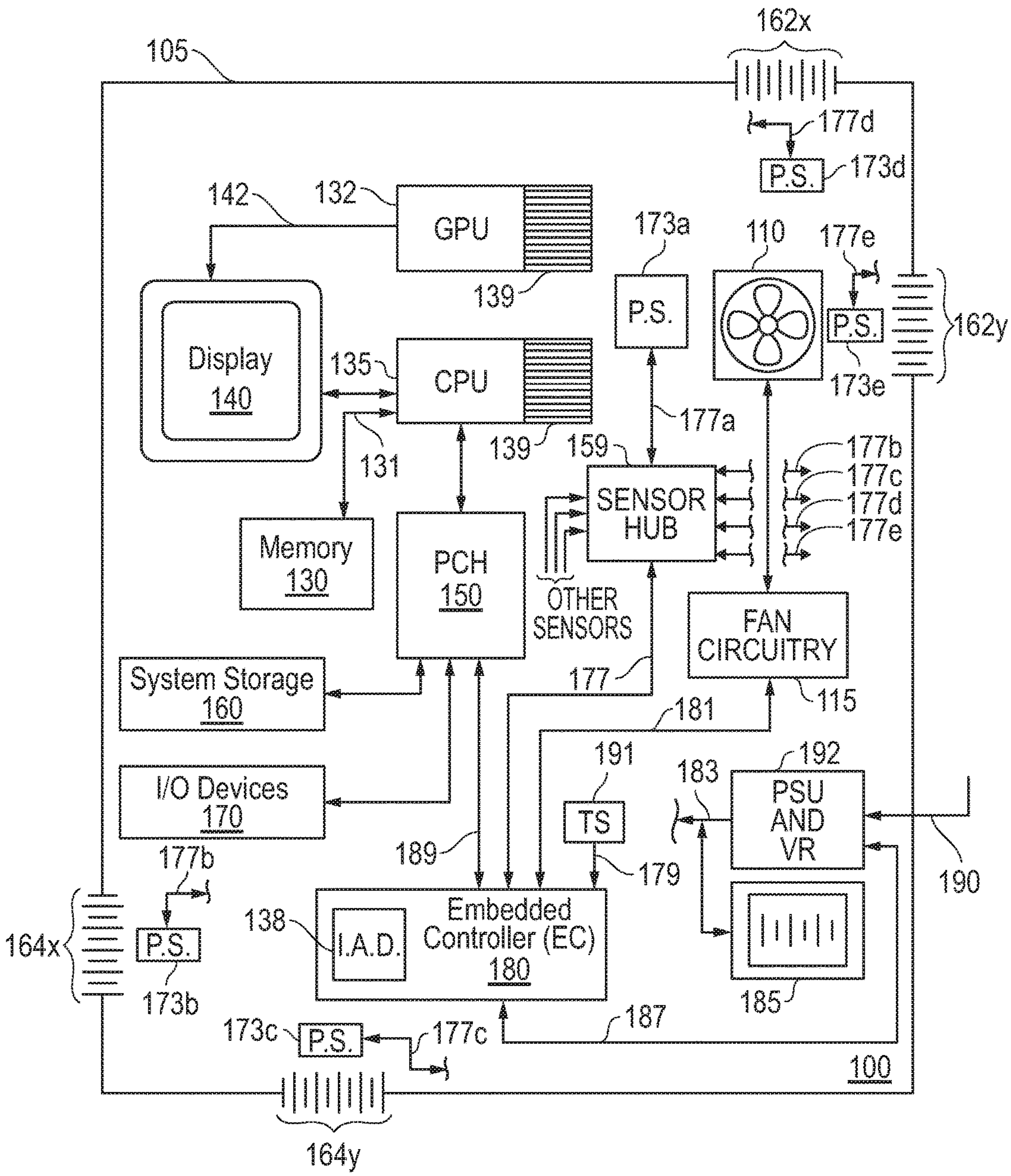
FIG. 1A illustrates a simplified block diagram of an information handling system according to one exemplary embodiment of the disclosed systems and methods.
Figure 1B:
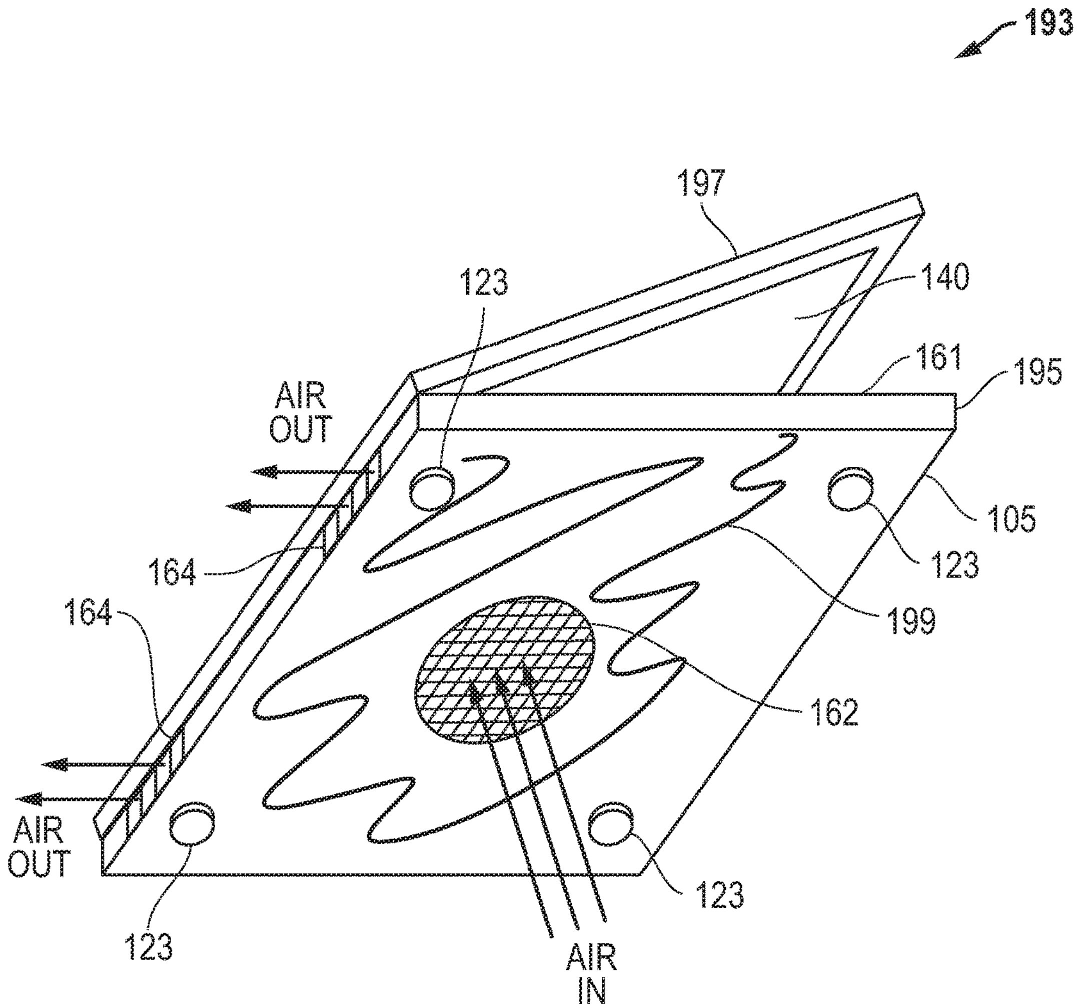
FIG. 1B illustrates a bottom perspective view of a chassis enclosure of a portable information handling system according to one exemplary embodiment of the disclosed systems and methods.

FIG. 1A is a block diagram of an information handling system 100 (e.g., a portable information handling system such as a notebook computer, tablet computer, convertible computer, etc.) as it may be configured according to one embodiment of the disclosed systems and methods. As shown in FIG. 1A, information handling system 100 may include a chassis enclosure 105 (e.g., plastic enclosure, sheet metal enclosure, etc.) that encloses internal components of the information handling system 100 therein. It will be understood that the outer dimensions and shape of the chassis enclosure 105 may vary according to the type and/or number of internal components of the system 100, and that chassis enclosure 105 may have a shape or configuration suitable for the particular application for which the system 100 is designed (e.g., two-piece hinged clamshell enclosure for a notebook computer as shown in FIG. 1B, single-piece unitary enclosure for a tablet computer, etc.). In this regard, it will be understood that the configuration of FIG. 1A is exemplary only, and that the disclosed apparatuses and methods may be implemented with other types of information handling systems, such as desktop or tower type information handling systems which do not include integrated display and/or integrated input/output components like touchpad and keyboard.

As shown in FIG. 1A, information handling system 100 includes at least one host processing device configured in this embodiment as a central processing unit (CPU) 135 that executes an operating system (OS) for system 100. CPU 135 may include, for example, an Intel Xeon series processor, an Advanced Micro Devices (AMD) processor or another type of processing device. Also shown in FIG. 1A is optional graphics processing unit (GPU) 132 that is coupled in signal communication with CPU 135 (e.g., by conductor including PCI-Express lanes, power supply bus, power, thermal and system management signals, etc.) that transfers instructions and data for generating video images from CPU 135 to the GPU 132 Optional GPU 132 may be an NVidia GeForce series processor, an AMD Radeon series processor, or another type of processing device that is configured to perform graphics processing tasks and provide a rendered video image (e.g., as frame buffer data) by output digital video signals 142 (e.g., HDMI, DVI, SVGA, VGA, etc.) to integrated display 140 (e.g., LED display, LCD display, or other suitable type of display device) of system 100. It will be understood that in other embodiments CPU 135 may alternatively provide video images directly to integrated display 140, including in those cases where optional GPU 132 is not present.

Still referring to the exemplary embodiment of FIG. 1A, CPU 135 is shown coupled to system memory 130 via data channel 131. System memory 130 may include, for example, random access memory (RAM), read only memory (ROM), dynamic RAM (DRAM), synchronous DRAM (SDRAM), and/or other suitable storage mediums. CPU 135 is also coupled to platform controller hub (PCH) 150, which facilitates input/output functions for information handling system 100. Local system storage 160 (e.g., one or more media drives, such as hard disk drives, optical drives, non-volatile random access memory "NVRAM", Flash or any other suitable form of internal storage) is coupled to PCH 150 to provide non-volatile storage for the information handling system 100. Integrated input/output devices 170 (e.g., a keyboard, touchpad, touchscreen, etc.) are coupled to PCH 150 as shown to enable the user to interact with components of information handling system 100 including application programs or other software/firmware executing thereon.

In the embodiment of FIG. 1A, an embedded controller (EC) 180 is coupled to PCH 150 by data bus 189 and is configured to perform out-of-band and system tasks including, but not limited to, providing control signals 187 to control operation of power supply/voltage regulation circuitry 192 that itself receives external power 190 (e.g., direct current power from an AC adapter or alternating current from AC mains) and in turn provides suitable regulated and/or converted direct current power 183 for operating the system power-consuming components and for charging system battery pack 185. EC 180 may also supply control signals 181 to fan control circuitry 115 for controlling direction of air flow produced by cooling fan/s 110, control signals across bus 189 to control power throttling for processing devices 135 and/or 132 based on internal system temperature measurement signals 179 received from one or more temperature sensors 191 inside or on chassis enclosure 105, etc. It will be understood that one or more such tasks may alternatively or additionally be performed by other processing device/s of an information handling system 100.

In the embodiment of FIG. 1A, one or more of the components of system 100 may be characterized as heat-generating components that generate or otherwise produce heat during operation. Examples of heat-generating components include, but are not limited to, CPU 135 and GPU 132. In the illustrated embodiment, each of CPU 135 and GPU 132 In the illustrated embodiment, each of CPU 135 and GPU 132 are provided with a heat sink and cooling fins 139 that are thermally-coupled to corresponding heat-generating component 135 or 132 to transfer heat from the heat-generating component to cooling air that is circulated through chassis enclosure 105 by at least one cooling fan 110 (e.g., centrifugal blower such as 80 mm×80 mm×8 mm centrifugal blower, or other suitable fan, etc.). It will be understood that other heat-generating components may also be present within chassis enclosure 105 (e.g., such as EC 180, PSU and VR 192, battery pack 185, display 140, etc.), and that not all heat-generating components need be provided with a heat sink 139 or other specific heat transfer apparatus or system. Moreover, it will be understood that the illustrated finned heat sinks 139 of FIG. 1A are exemplary only, and other types of cooling apparatus and systems may be present within chassis enclosure 105 for transferring heat from heat-generating components to cooling air that is moving through chassis 105. Examples of types of cooling apparatus and systems may be found, for example, in U.S. patent application Ser. No. 15/585,509 filed on May 3, 2017, and in U.S. patent Ser. No. 15/802,054 filed on Nov. 2, 2017, each of which is incorporated herein by reference in its entirety for all purposes.

Still referring to FIG. 1A, at least one reversible cooling fan 110 may be provided to draw in ambient air for cooling into chassis enclosure 105 (e.g., through at least one air inlet 162 formed by perforations defined in an external wall of chassis enclosure), and to circulate or otherwise move the drawn-in cooling air through chassis enclosure 105 and expel it out of chassis enclosure 105 (e.g., through at least one air outlet 164 formed by perforations defined in an external wall of chassis enclosure 105). Cooling fan 110 may be any type of reversible cooling fan configuration capable of creating air flow in the opposite direction when rotation is reversed, e.g., such as an axial fan or a cross-flow fan that has a fan blade design that is suitable for reverse rotation direction operation to produce a reverse air flow direction for at least relatively small periods of time (e.g., such as one minute or less). Other examples of suitable reversible cooling fan configurations include, for example, a centrifugal fan apparatus as described in United States Patent Application Publication Number 20120026677, which is incorporated herein by reference in its entirety for all purposes.

Perforations of air inlets 162 and air outlets 164 may be defined in walls of chassis enclosure 105 with any suitable configuration to allow cooling air to pass into and out of chassis enclosure, e.g., as a grid or an array of circular or rectangular openings defined in an external wall of chassis enclosure. In the embodiment of FIG. 1A, cooling fan 110 is positioned so that it operates to move the cooling air in a path through chassis enclosure 105 that causes the moving cooling air to contact and absorb heat produced by heat generating components of system 100 (in this case via fins of heat sink 139 of CPU 135 and fins of heat sink 139 of GPU 132) before the heated cooling air is then expelled out of chassis enclosure 105. As will be described further herein, direction of air flow produced by cooling fan 110 may also be configured to be reversible in response to control signals 181 from EC 180, e.g., so as to reverse the direction of cooling air flow within chassis enclosure 105. Also present in FIG. 1A is at least one pressure sensor 173*a* that is coupled as shown to provide pressure measurement signals 177*a* representative of real time sensed air pressure to EC 180, in this case via optional sensor hub 159 (e.g., a measurement device configured as a system on a chip "SOC") that includes at least one microprocessor or configured as another processing device (e.g., such as integrated within CPU 135) that is configured to aggregate input signals provided by multiple sensors such as pressure sensors, temperature sensors, gyroscopes, accelerometers, velocity probes, etc. Sensors may additionally or alternatively be coupled directly to EC 180 as is temperature sensor 191 in FIG. 1A, in which case functions of sensor hub 159 may be integrated within EC 180.

As will be described further herein, a pressure sensor 173 may be positioned at a selected location within chassis enclosure 105 that exhibits air pressure fluctuations during operation of cooing fan 110 according to how freely cooling air flows through chassis 105 at any given time, e.g., between air inlet/s 162 and air outlet/s 164. In this regard, free movement of cooling air through chassis enclosure 105 may be partially or completely impeded by obstructions such as accumulation of dust or other debris within perforations of air inlet/s 162 and air outlet/s 164, within fins of heat sinks 139, or otherwise in the cooling air flow path within chassis enclosure 105. Other conditions that may partially or completely impede air flow and through chassis 105 and affect the air pressure at the selected location of pressure sensor 105 include, for example, blocking of air inlet/s 162 and air outlet/s 164 with an object such as a pillow or the user's body. In one embodiment, EC 180 may receive pressure measurement signals 177 from pressure sensor 173 and/or sensor hub 159, and may implement display of error message/s and/or an impeded air flow detection algorithm 138 that controls operation of cooling fan 110 based thereon in a manner as described further herein, e.g., in relation to FIGS. 5A and 5B.

In the embodiment of FIG. 1A, an absolute value of pressure sensed by a pressure sensor 173 at a given location within the cooling air flow path in chassis enclosure 105 will increase when air flow is impeded at that location. In this regard, the intake side of a cooling fan 110 pulls a vacuum when operating so that suction side vacuum will become greater (i.e., sensed negative pressure the fan 110 is pulling against will become more negative) as suction side air flow into cooling fan 110 becomes more impeded. On the other hand, sensed positive pressure on the discharge side of the fan 110 will become a higher positive pressure as discharge side air flow from cooling fan 110 becomes more impeded. Further, the absolute pressure difference (ΔP) between any two pressure sensors 173 may be used to determine pressure sensor differential along the cooling airflow path within chassis enclosure 105. For example, a first sensor 173 located near an inlet 162 and a second sensor 173 located next to suction of cooling fan 110 (between the first sensor 173 and the cooling fan 110) may be used to determine absolute pressure difference (ΔP) between those two locations and, for example, whether an air flow impediment exists between the locations of the first and second pressure sensors, or between the first pressure sensor 173 and the air inlet 162 or between the second pressure sensor 173 and suction of cooling fan 110.

It will be understood that other types of algorithms may alternatively or additionally be implemented by EC 180 or other processing device/s of system 100 (such as CPU 135 which may be a system on a chip) to take actions based on absolute air pressure value sensed by pressure sensor 173 during operation of system 100. For example, a processing device of sensor hub 159 may alternatively implement impeded air flow detection algorithm 138 and provide control signals for operating cooling fan 110, either directly or indirectly through EC 180.

FIG. 1B illustrates a perspective view of one exemplary embodiment of a chassis enclosure 105 that is configured as a two-piece hinged clamshell enclosure for a notebook computer 193. As shown, chassis enclosure 105 includes a base component 195 that is hingeably coupled to a lid component 197 that includes integrated display 140. In one embodiment, base component 195 encloses all other components of system 100 shown in FIG. 1A, including heat-generating components such as CPU 135, GPU 132, heat sinks 139, as well as cooling fan/s 110, fan circuitry 115 and EC 180. Also shown in FIG. 1B is a cooling air inlet 162 defined in a downward-facing (bottom) external planar surface 199 of base component 195 (e.g., planar surface indicated in FIG. 1B by surface indicia), and two cooling air outlets 164 defined in a back side of base component 195, it being understood that number, positioning and configuration of cooling air inlets and outlets may vary in other embodiments. Feet (e.g., rubber spacer pads) 123 are provided as shown near four corners of bottom surface 199 for resting on the surface of a table or desk to provide airflow space between the bottom surface 199 and the table or desk top surface 199. In the illustrated notebook computer embodiment, the major plane of chassis enclosure base component 195 may be characterized as being parallel with the planar bottom surface 199, i.e., such that keys of an integrated keyboard face outward from a top side 161 of base component 195 in a position for accepting typing input from a user when the bottom surface 199 of the chassis enclosure is placed on a user's lap or on a substantially horizontal surface such as a desk or table.

In the illustrated notebook computer embodiment, the major plane of chassis enclosure base component 195 may be characterized as being parallel with the planar bottom surface 199, i.e., such that keys of an integrated keyboard face outward from a top side 161 of base component 195 in a position for accepting typing input from a user when the bottom surface 199 of the chassis enclosure is placed on a user's lap or on a substantially horizontal surface such as a desk or table.

Figure 2A:
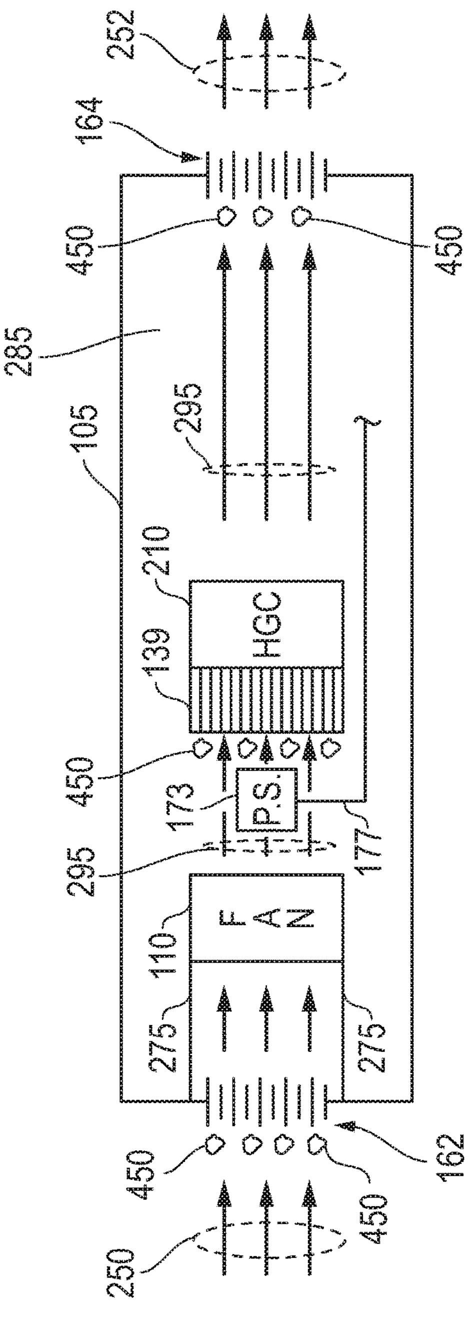
FIG. 2A illustrates a simplified side cross-sectional view of an information handling system chassis enclosure according to one exemplary embodiment of the disclosed systems and methods.
Figure 2B:
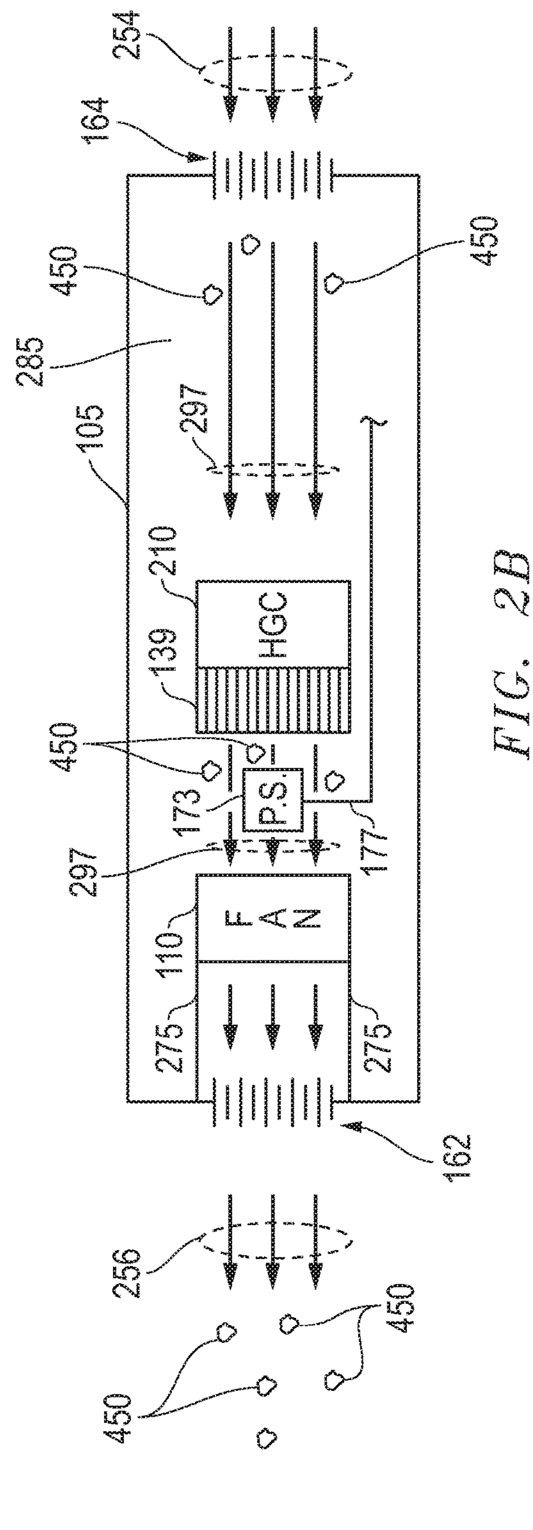
FIG. 2B illustrates a simplified side cross-sectional view of an information handling system chassis enclosure according to one exemplary embodiment of the disclosed systems and methods.

FIGS. 2A and 2B illustrate a side cross-sectional view of one exemplary embodiment of the positioning of a pressure sensor 173 relative to one or more cooling fan/s 110 and fins of a heat sink 139 of a heat-generating component 210 within a chassis enclosure 105 (e.g., notebook or laptop computer base chassis component, server or desktop computer tower chassis component, etc.) such as shown in FIG. 1. In each of FIGS. 2A and 2B, the suction side of the cooling fan/s 110 for the given illustrated mode of operation is shown by arrows incoming into the fan, and the discharge side of the cooling fan/s 110 for the given illustrated mode of operation shown by arrows outgoing from the cooling fan/s 110. As shown in FIGS. 2A and 2B, an air conduit 275 (e.g., sealed shroud or other suitable air conducting conduit) may be optionally provided between cooling fan 110 and an air inlet 162 for facilitating intake of ambient cooling air 250 from outside the chassis enclosure into an interior 285 of chassis enclosure 105 to draw ambient cooling air 250 into interior 285 of chassis enclosure 105 through air inlet 162 so as to move the cooling air through in a first direction through an internal cooling air flow path 295 within the chassis enclosure 105 and to expel heated cooling air 252 out of the interior 285 through air outlet 164 as shown. It will be understood that any other cooling fan configuration may be employed to allow cooling fan 110 to draw ambient cooling air 250 into interior 285 of chassis enclosure 105 through air inlet 162 so as to move the cooling air in a first direction through an internal cooling air flow path 295 within the chassis enclosure 105 and to expel heated cooling air 252 out of the interior 285 through air outlet 164 as shown.

In the embodiment of FIGS. 2A and 2B, pressure sensor 173 is positioned between cooling fan/s 110 and each of heat generating component 210 and air outlet 164 with cooling fan/s 110 positioned between pressure sensor 173 and air inlet 162. FIG. 2A shows cooling fan/s 110 operating to move air through chassis enclosure 105 in normal system cooling direction (e.g., first direction). In FIG. 2A, cooling fan/s 110 may be controlled by EC 180 to draw in ambient cooling air 250 from outside chassis enclosure 105, and to circulate this cooling air across fins of heat sink 139 where the cooling air 250 absorbs heat from fins of heat sink 139 so as to cool heat-generating component 210. The now-heated air 252 of FIG. 2A then passes out of chassis enclosure 105 through air outlets 164. When flow of cooling air is unimpeded through chassis enclosure 105, absolute value of air pressure sensed by pressure sensor 173 will remain within a baseline absolute pressure value range that is a function of the cooling fan displacement (cubic feet per minute "CFM") together with the cross-sectional open flow area of inlet/s 162 and outlet/s 164 and any other cooling air passages (e.g., such as fins of heat sink 139) and/or obstructions that are present in the cooling air flow path between cooling air inlet 162 and cooling air outlet 164. This baseline absolute pressure value range may be empirically determined for a particular system and chassis configuration, for example, by measurement in the laboratory or manufacturing facility.

As shown in FIG. 2A, dust or other particles of debris 450 that are present in the incoming ambient cooling air 250 may accumulate over time on or within one or more of the perforations of cooling air inlet 162 and/or cooling air outlet 164 and/or other cooling air passages (e.g., heat sink fins) through which the cooling air flows during normal cooling operation. During this time EC 180 or other suitable processing device may monitor air pressure within the cooling air flow by pressure sensor 173. As these debris 450 accumulate over time in the air flow path, absolute value of air pressure at the location of pressure sensor 173 will increase due to impedance of the flow of cooling air through chassis enclosure 105 by the blocking action of the accumulated debris 450 in the air flow path through chassis enclosure 105.

FIG. 2B illustrates how cooling fan/s 110 may be controlled (e.g., automatically by impeded air flow detection algorithm 138) to reverse the direction of air flow through chassis enclosure 105 in a second direction when air pressure measured by pressure sensor 173 meets or exceeds a predetermined critical absolute pressure threshold value that is above the normal absolute pressure value range. As shown in FIG. 2B, when air flow is reversed ambient air 254 is now drawn in to chassis enclosure 105 through cooling air outlet 164, and exhaust air 256 exits chassis enclosure 105 through air inlet 162. The physical action of the reversed cooling air flow 297 (through all or portion of the same air flow path as FIG. 2A but in opposite direction) acts to dislodge debris particles 450 from each of perforations of cooling air inlet 162, cooling air outlet 164 and fins of heat sink 139. As shown, at least some of the debris particles 450 may be carried out of chassis enclosure 105 by exhaust air 256 as shown. In one embodiment, the reverse air flow operation of FIG. 2B may be implemented temporarily before cooling fan/s 110 are controlled to reverse the direction of cooling air flow through chassis enclosure 105 so that the cooling air flow again flows through chassis enclosure 105 in the normal cooling direction illustrated in FIG. 2B. At this time EC 180 may again monitor air pressure sensed by pressure sensor 173 in the manner previously described. It will be understood that the reversed second direction may move air through the chassis enclosure in a second air flow path that is different than the first air flow path, or that is the same as the first air flow path (in which case the second direction may be opposite or reversed to the first direction.

Figure 3A:
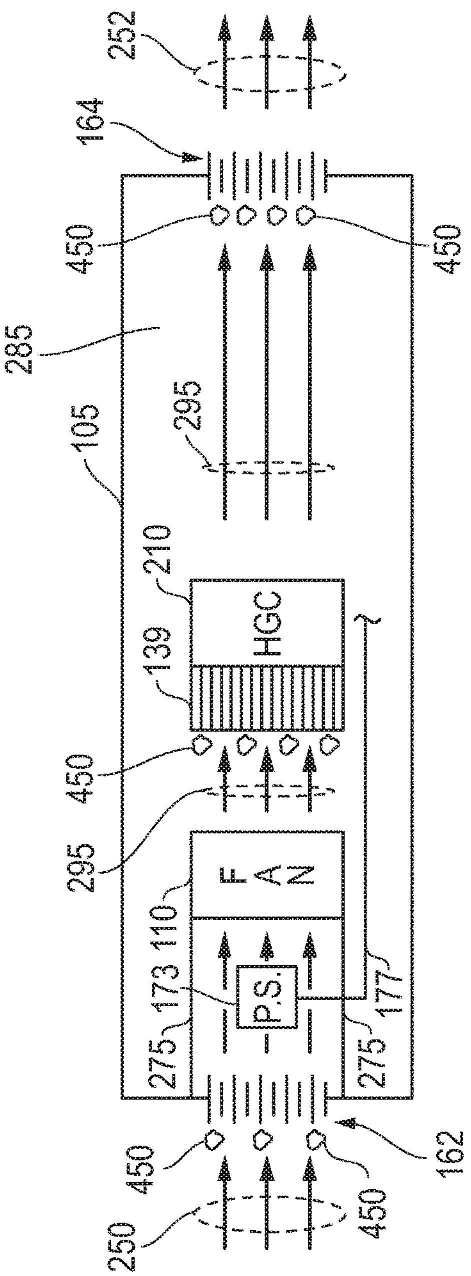
FIG. 3A illustrates a simplified side cross-sectional view of an information handling system chassis enclosure according to one exemplary embodiment of the disclosed systems and methods.
Figure 3B:
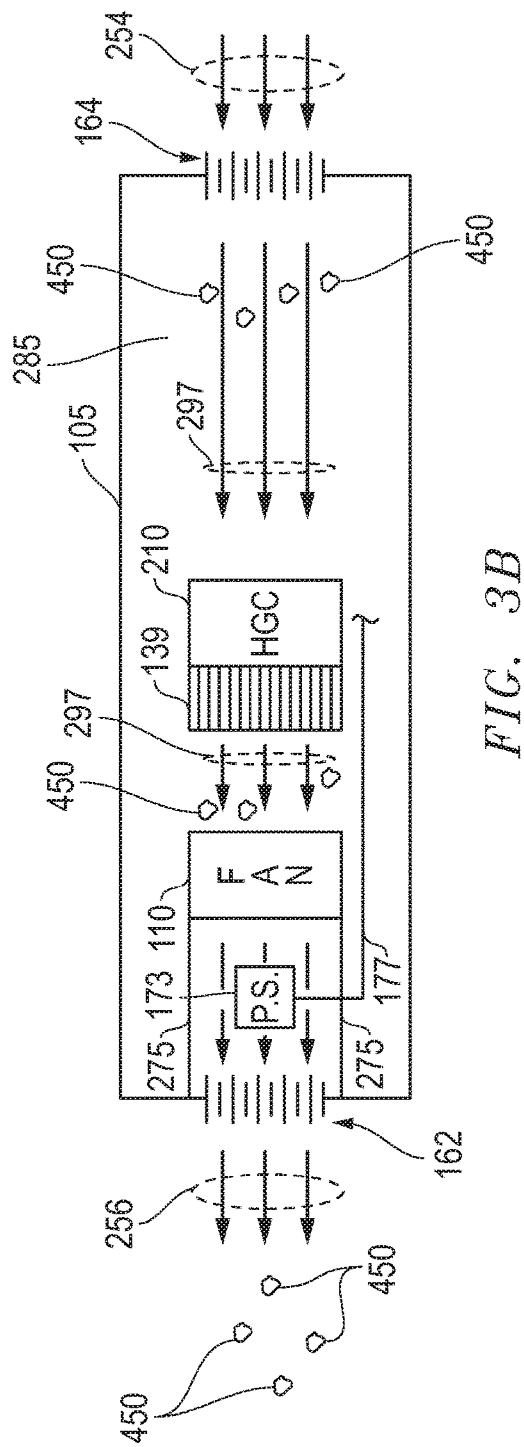
FIG. 3B illustrates a simplified side cross-sectional view of an information handling system chassis enclosure according to one exemplary embodiment of the disclosed systems and methods.

It will be understood that FIGS. 2A and 2B illustrate just one exemplary embodiment, and that one or more pressure sensor/s 173 may be placed at any other suitable location/s within a chassis enclosure 105 where air pressure varies due to accumulation of debris during normal cooling air flow direction. For example, FIGS. 3A and 3B illustrate an alternate embodiment for positioning of a pressure sensor 173 relative to cooling fan/s 110 and fins of a heat sink 139 within a chassis enclosure 105. In this alternate embodiment, pressure sensor 173 is positioned between air inlet 162 and cooling fan/s 110 with cooling fan/s 110 positioned between pressure sensor 173 and each of heat generating component 210 and air outlet 164. FIG. 3A illustrates normal cooling flow direction through chassis enclosure 105, during which debris 450 accumulate in similar manner as described in relation to the embodiment of FIG. 2A as long as absolute value of air pressure measured by pressure sensor 173 remains below a predetermined critical absolute pressure threshold value. FIG. 3B illustrates reversed cooling air flow that is initiated when absolute value of air pressure measured by pressure sensor 173 meets or exceeds the predetermined critical absolute pressure threshold value in a similar manner as described in relation to the embodiment of FIG. 2B.

In one embodiment, by positioning multiple pressure sensors 173 in different locations along the airflow path through the chassis enclosure 105 it is possible to obtain a granular information on where an airflow impediment or airflow blockage is located, e.g., to determine that air flow impediment is located at an air inlet 162 rather than an air outlet 164 or vice-versa, whether impediment is located at a heat sink fins 139 rather than an air outlet 164 or vice versa, etc. Based on this information, a message may be displayed or otherwise communicated to a user that instructs the user to clear the air flow impediment, e.g., such as to remove a detected external obstruction (e.g., pillow, blanket etc.) from the determined location.

For example, returning to FIG. 1A, a first pressure sensor 173*a* is shown positioned between heat sinks 139 and cooling fan 110. Optional pressure sensors 173*b* and 173*c* are shown positioned between cooling fan 110 and respective air outlets 164*x* and 164*y*, and optional pressure sensors 173*d* and 173*e* are shown positioned between cooling fan 110 and respective air inlets 162*x* and 162*y*. In this optional configuration, respective real time pressure measurement signals 177*a*, 177*b*, 177*c*, 177*d* and 177*e* may be provided to sensor hub 159 and routed to EC 180 in the manner as previously described. The absolute real time pressure difference (ΔP) between any two of sensors 177*a*-177*e* may be determined at any time to determine location of cooling air path impediments, e.g., when absolute real time pressure difference (ΔP) between a given pair of sensors 173 meets or exceeds an absolute critical real time pressure difference (ΔPc) value.

Figure 4:
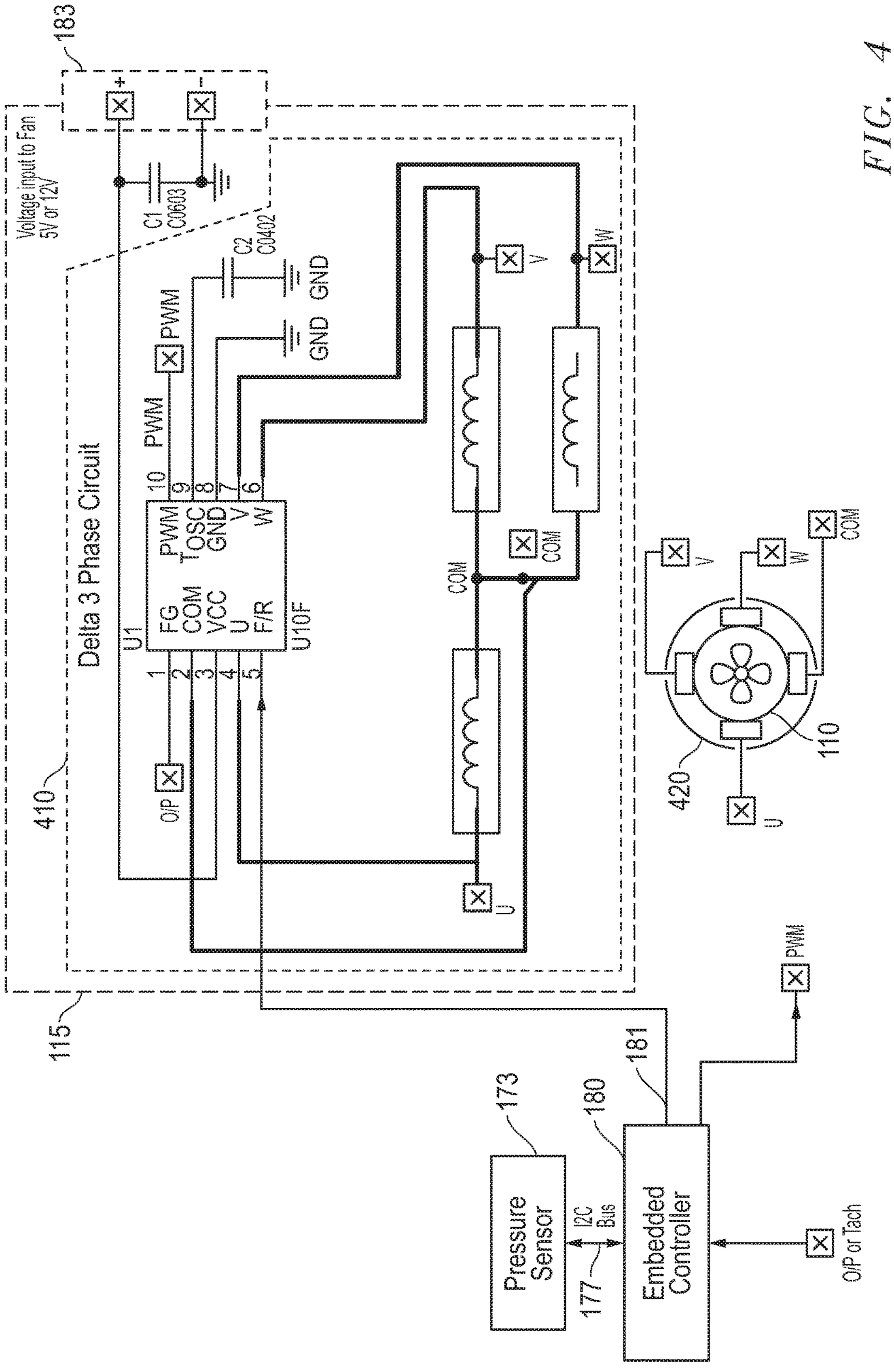
FIG. 4 illustrates a simplified diagram of fan control circuitry coupled between an embedded controller and a cooling fan according to one exemplary embodiment of the disclosed systems and methods.

FIG. 4 illustrates one exemplary embodiment of fan control circuitry 115 coupled between EC 180 and a brushless direct current fan motor 420 that rotates cooling fan 110. Also shown is pressure sensor 173 coupled to provide sensed pressure signals 177 to EC 180 (e.g., via I2C bus or other suitable data bus). Pressure sensor 173 may be any suitable sensor configured to sense air pressure, such as a digital barometric air pressure sensor integrated circuit. For example, in one embodiment pressure sensor 173 may be a ST Micro LPS22HB Nano pressure sensor (digital output barometer) available from STMicroelectronics of Geneva, Switzerland that is capable of sensing from 260 to 1260 hPa absolute pressure range. In the illustrated embodiment, cooling fan 110 may be rotated by fan motor 420 in either of a clockwise or counterclockwise direction according to phase output signals (U, V and W) received from 3-phase motor controller (U1) 415 of delta 3-phase circuit 410 of fan circuitry 115, which responds to forward or reverse (F/R) control signals 181 provided by EC 180. In this embodiment, brushless direct current fan motor 420 employs Hall-effect sensors triggered by the relative positions of the motor magnets to energize the windings in a sequence that causes fan motor rotation in the desired direction, and fan motor rotation direction may be reversed when specified by control signals 181 by reversing the leads to all of the electromagnetic windings. Table 1 below lists functions of the exemplary signals shown in FIG. 4. In this embodiment, a closed loop feedback is used to control cooling fan speed based on fan speed tachometer input to EC 180 as shown, e.g., if tachometer is reading 2000 RPM current fan speed, and EC 180 (or other processing device) determines (e.g., based upon sensed temperature from sensor 191) that fan speed should be 2200 RPM, then PWM signal output from EC 180 will increase until the close loop tachometer speed feedback indicates a current fan speed of 2200 RPM has been achieved.

TABLE 1

Fan Control Circuitry Signals

| Signal | Signal Function |
|---|---|
| U, V, W | 3 phase output signals |
| COM | Common or ground |
| PWM | Pulse width modulated for controlling FAN speed |
| F/R | Forward or Reverse control |
| O/P or Tach | Fan Tachometer Input (for direct fan speed measurement), number of pulses per rotation = RPM |

It will be understood that fan circuitry 115, fan motor 420 and fan 110 of FIG. 4 are exemplary only, and that any other type of fan motor, fan mechanism, and/or fan control circuitry may be employed that is controllable to reverse cooling air flow through an information handling system chassis enclosure such as chassis enclosure 105. For example, in just one example of an alternative embodiment, multiple cooling fans (including non-reversible cooling fans) may be selectively operated one at time to move cooling air through a chassis enclosure 105 in multiple directions, e.g., by first operating a first cooling fan to blow air in a first direction within a chassis enclosure 105 and then switching to operate a second cooling fan to blow air in a second direction within the same chassis enclosure 105 that is opposite to the first direction.

Figure 5A:
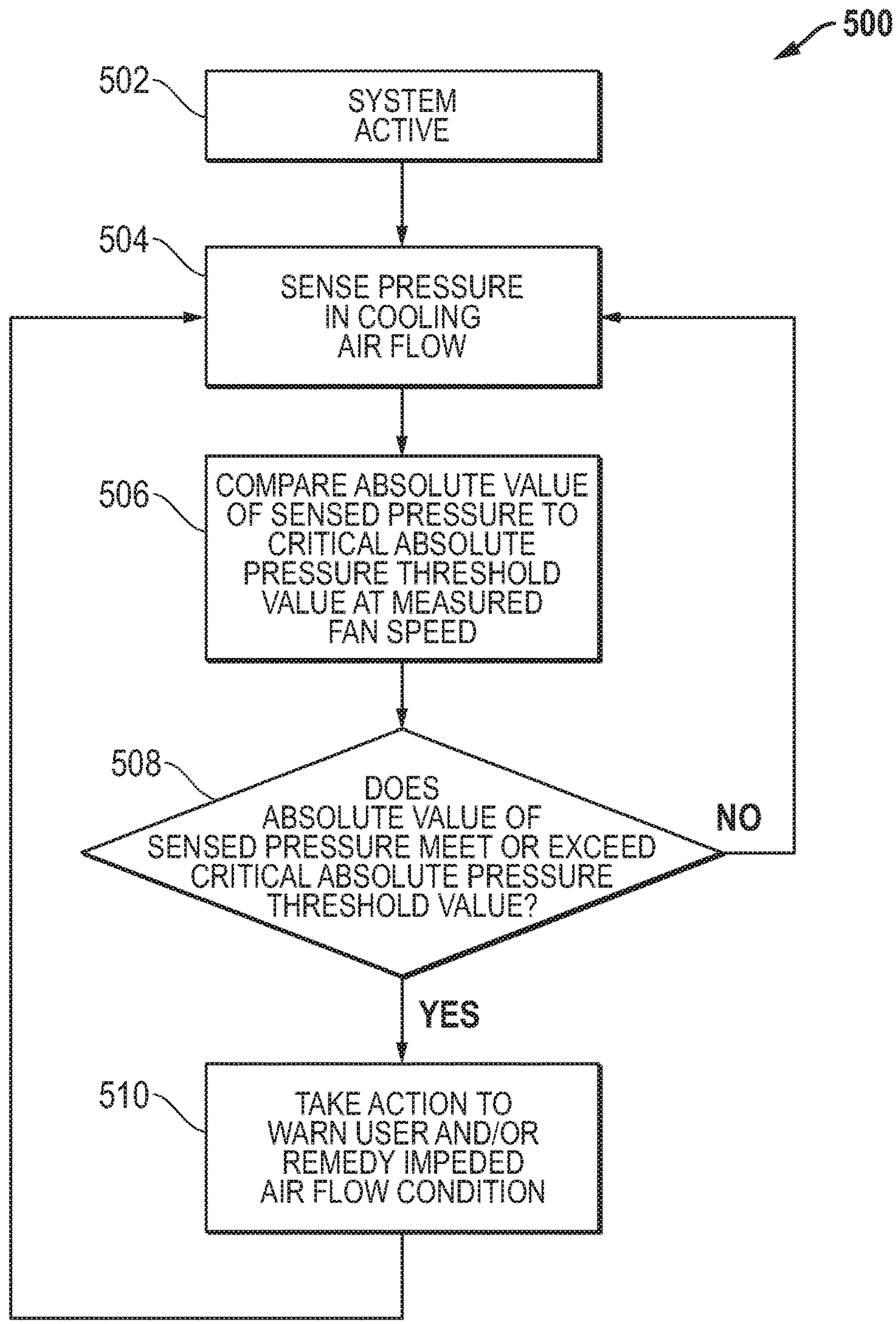
FIG. 5A illustrates methodology according to one exemplary embodiment of the disclosed systems and methods.

FIG. 5A illustrates one exemplary embodiment of methodology 500 which may be implemented to detect impeded air flow in a chassis enclosure of an information handling system, such as chassis enclosure 105 information handling system 100 of FIG. 1A. Methodology 500 may be implemented, for example, by EC 180, processing device within sensor hub 159, or other suitable processing device/s of an information handling system such as system 100 of FIG. 1A. For purposes of illustration, methodology 500 will be described in relation to system embodiment 100 of FIG. 1A. However, it will be understood that methodology 500 may be implemented with other types of information handling system configurations that include cooling fans including, for example, desktop or server systems, tablet systems, etc.

As shown in FIG. 5A, methodology 500 starts in step 502 with information handling system active with system OS booted and executing on active CPU 135, and with EC 180 active and controlling cooling fan/s 110 to circulate cooling air through chassis enclosure 105 in a first (e.g., normal) flow direction such as illustrated in FIG. 2A or 3A. As shown, pressure sensor 173 is active in step 504 and sensing real time air pressure (including any air pressure changes within chassis enclosure 105) and reporting the sensed pressure to the processing device executing methodology 500, e.g. such as EC 180. Speed (e.g., RPM) of fan/s 110 may in one embodiment be measured from fan speed Tachometer input to EC 180 and also used by the processing device executing methodology 500 to determine the critical absolute pressure at the current measured current fan speed. In this regard, a look up table (or other relationship) between fan speed and critical absolute pressure values may be stored in system non-volatile memory and used to determine the critical absolute pressure value at any given fan speed. In step 506, methodology 500 compares the absolute value of current real time sensed pressure to a predetermined critical absolute pressure threshold value that is determined at the current real time measured fan speed from a relationship stored, for example, in a thermal table maintained in system basic input/output system firmware (BIOS) stored on non-volatile memory 130 or other suitable data storage of system 100.

Table 2 below illustrates exemplary thermal table values provided for purposes of illustration only, and that includes example values of absolute high inlet pressure, absolute critical absolute pressure threshold and maximum fan operation for use in methodologies of FIGS. 5A and 5B described herein. As an illustrative example only, Table 2 below includes a stored predetermined critical absolute pressure threshold value that is dependent on current real time fan speed, and that is indicative of impeded cooling air flow at the current fan speed through chassis 105 at the location of pressure sensor 173. In this illustrative example, a range of normal absolute value real time air pressure range measured at the location of pressure sensor 173 during unimpeded cooling air flow through chassis 105 will vary depending on cooling fan speed.

TABLE 2

Thermal Table Pressure Values

| Fan Speed Mode | Fan Speed RPM | Absolute High Inlet Pressure Threshold ($inH_2O$) | Critical Absolute Pressure Threshold ($inH_2O$) | Critical Absolute Δ Pressure Threshold ($inH_2O$) |
|---|---|---|---|---|
| Fan Off | 0 | N/A | N/A | N/A |
| Fan Low | 1000 | 0.03 | 0.05 | 0.02 |
| Fan Medium | 2000 | 0.07 | 0.10 | 0.03 |
| Fan Medium High | 3000 | 0.12 | 0.15 | 0.05 |
| Fan High | 4000 | 0.17 | 0.21 | 0.07 |
| Reverse Air Flow Operation for Cleaning (High Speed) | 4000 | N/A | N/A | N/A |

Table 2 also lists example absolute critical real time pressure difference (ΔPc) values, e.g., for absolute real time pressure difference (ΔP) measured between a pressure sensor located inside the chassis enclosure 105 at the under system inlet 162 of FIG. 1B and a pressure sensor located inside the chassis enclosure 105 at an intake or suction of fan 110. As an example, assuming that the pressure sensor at system inlet 162 is reading −0.03 $inH_2O$ (inches of water) at the same time that the sensor at the intake of fan 110 is reading −0.1 $inH_2O$, then the measured absolute real time pressure difference (ΔP) between these two pressure sensors will be determined to be 0.07 $inH_2O$, which may then be compared to the data of the rightmost column of Table 2. Assuming that the current fan speed is 3000 RPM (i.e. having a 0.05 absolute ΔPc threshold value), then the absolute ΔPc threshold value will not only be met, but exceeded. This may be used in the methodology disclosed herein to trigger an action such as cooling air flow reversal, alert indication to user, etc. It will be understood that the absolute critical pressure threshold values determined for any given application as function of fan speed may depend on actual system configuration factors such as foot height of system, perforation percentage, location of pressure sensors etc.

It will be understood that the above values are exemplary only, and that a critical absolute pressure threshold value may be determined (e.g., by empirical measurement in a test laboratory) to be any other value that is representative of impeded air flow corresponding to a given combination of chassis enclosure configuration and pressure sensor location. Moreover, in an alternate embodiment, a single critical absolute pressure value may be pre-defined and employed to determine impeded air flow, regardless of actual fan speed (and/or in the case of a cooling fan that operates at only one speed).

Still referring to FIG. 5A, if absolute value of real time sensed pressure from pressure sensor 173 does not meet the predetermined critical absolute pressure threshold value in step 508, then methodology 500 returns to step 504 and repeats. However, if absolute value of real time sensed pressure from pressure sensor 173 is determined to meet or exceed the predetermined critical absolute pressure threshold value in step 508, then methodology 500 proceeds to step 510 where action is taken to warn the user of the impeded air flow condition and/or to remedy the impeded air flow condition before returning to step 504 and repeating. For example, in one exemplary embodiment, an error message may be displayed in step 510 on display 140 that warns the user of the detected impeded air flow condition. Thus, a user may be made aware of a condition where a pillow or other object is obstructing the air inlet/s or outlet/s of a notebook computer system 100 so that the user may take corrective action by repositioning the system 100 so that the air inlet/s or outlet/s are no longer obstructed. The error message may be displayed as long as methodology 500 repeats with impeded air flow condition detected in step 508. When methodology repeats to step 508 and determines that absolute value of sensed pressure no longer meets or exceeds the critical absolute pressure threshold (e.g., due to the user's corrective action), the error message is no longer displayed.

In another embodiment, action may be taken in step 510 to remedy the impeded air flow condition in addition to, or as an alternative to, displaying a warning to the user on display 140. For example, a F/R control signal 181 may be provided in real time to fan circuitry 115 (e.g., while system 100 and operating system on CPU 135 are booted up and actively running) to cause temporary reversal (e.g., for about 10 seconds or other suitable greater or lesser temporary time period) of cooling fan direction, e.g., as illustrated in FIGS. 2B and 3B. In one embodiment internal chassis and component temperatures of system 100 and/or laptop or notebook external chassis skin temperature ($T_{SKIN}$) may be optionally monitored (e.g., using temperature sensor 191) during reversed fan operation, and the system components shut down upon detection of a system temperature that exceeds a defined high temperature limit (e.g., a predefined high $T_{SKIN}$ limit) to ensure overheating does not occur within chassis enclosure 105 while the system is reversed. Such a high $T_{SKIN}$ limit may be predefined to fit the characteristics of a given information handling system application and stored in system non-volatile memory, e.g., as an illustrative example high $T_{SKIN}$ limit may be predefined in one exemplary embodiment to be a 48° C. outside chassis surface temperature (e.g., notebook computer chassis underside outside surface temperature) for continuous touch at a 25° C. ambient temperature, it being understood that any greater or lesser outside chassis surface temperature limit value may be so predefined. In one embodiment, high $T_{SKIN}$ limit may be predefined as an sensed outside chassis surface temperature regardless of ambient temperature (e.g., 48° C. outside chassis surface temperature regardless of ambient temperature).

Figure 5B:
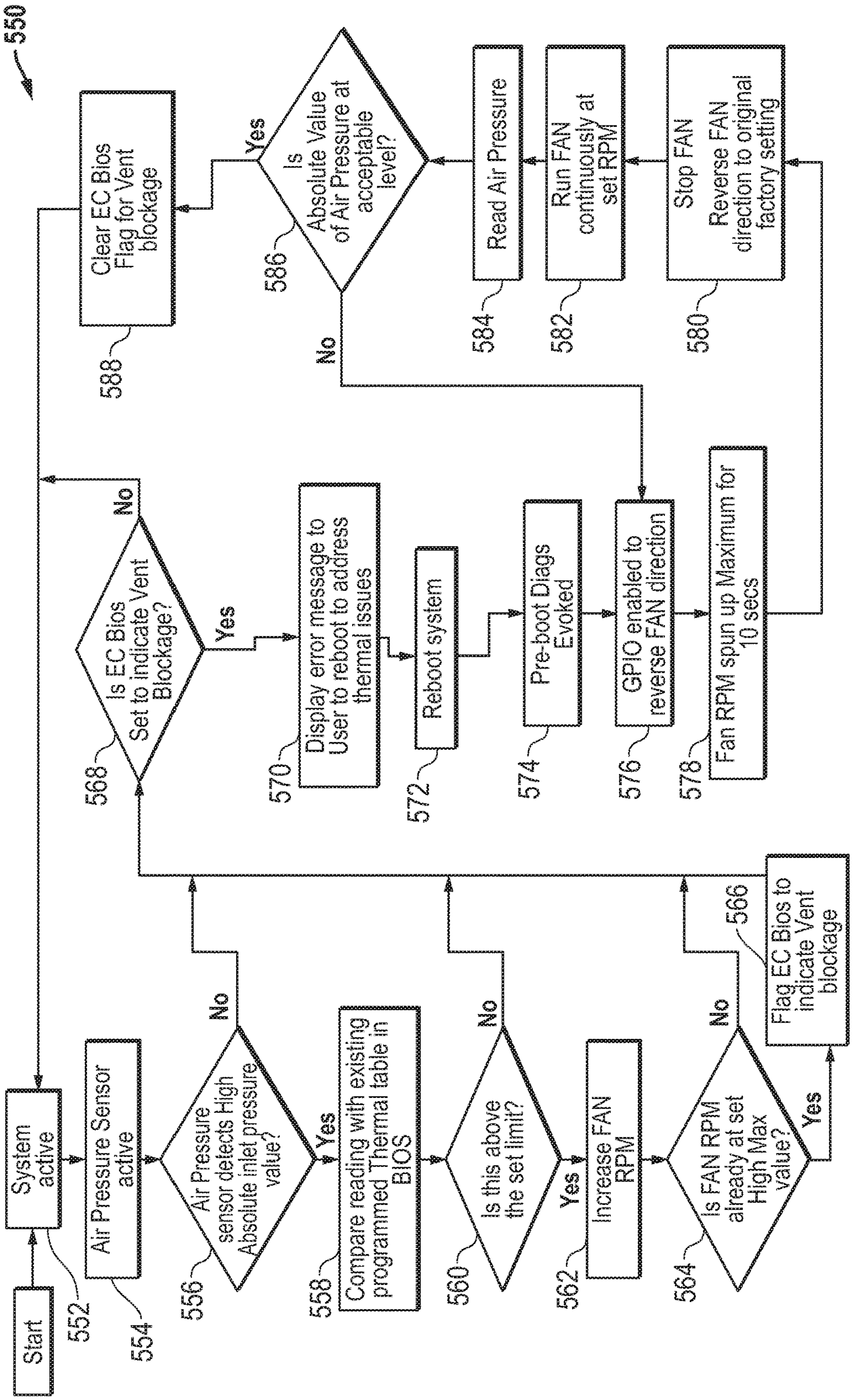
FIG. 5B illustrates methodology according to one exemplary embodiment of the disclosed systems and methods.

FIG. 5B illustrates another exemplary embodiment of an impeded air flow detection algorithm or methodology 550 which may be implemented, for example, as impeded air flow detection algorithm 138 by EC 180, processing device within sensor hub 159, or other suitable processing device/s of an information handling system such as system 100 of FIG. 1A. As described below, methodology 550 may be employed to monitor real time sensed pressure air pressure within chassis enclosure 105 and to set a flag for EC 180 or other processing device of system 100 upon detection of absolute air pressure value indicative of an impeded air flow condition (e.g., due to blocked air inlets and/or air outlets) within chassis enclosure 105, and to implement a temporary duration of reversed air flow through chassis enclosure 105 during the subsequent system boot (or alternatively during a subsequent diagnostic routine run by a service technician) based upon detection of the presence of the flag in EC 180 or other processing device. For purposes of illustration, methodology 550 will be described in relation to system embodiment 100 of FIG. 1A. However, it will be understood that methodology 550 may be implemented with other types of information handling system configurations that include cooling fans including, for example, desktop or server systems, tablet systems, etc.

As shown in FIG. 5B, methodology 550 starts in step 552 with information handling system active with system OS booted and executing on active CPU 135, and with EC 180 active and controlling cooling fan/s 110 to circulate cooling air through chassis enclosure 105 in a first (e.g., normal) flow direction such as illustrated in FIG. 2A or 3A. As shown, pressure sensor 173 is active in step 554 and sensing real time absolute air pressure value within chassis enclosure 105. In an optional step 556, methodology 550 determines if absolute air pressure value is high (e.g., at a location between air inlet 162 and fan 110 or other suitable location as described previously). If not, then methodology proceeds to step 568 where it is determined that no air flow impedance flag is set in EC Bios (i.e., per step 566 below), and then repeats to step 552.

In one embodiment, the value of high inlet pressure of step 556 may be selected and so employed as an optional base threshold to minimize computational overhead by delaying operation of the impeded cooling flow algorithm (e.g., not running the algorithm and/or related circuitry) until the sensed pressure reaches the high inlet pressure and risk of overheating has increased, at which time the algorithm and any related circuitry may be turned on. In another embodiment, high inlet pressure of step 556 may be employed for finer granularity of communication to a system user. For example, detection of high inlet pressure in step 556 may be used as a trigger to inform the system user of the existence of a reduced cooling capacity condition in the system, e.g., the "Yes" arrow from step 556 may proceed directly to an optional step where a message is displayed or other alert indication provided to alert the user that the system is starting to experience increased cooling air flow path blockage but that no action is needed at the current time. It will be understood that an alert indication provided herein may be any other suitable type of alert indication such as audible warning to the user through system speakers (e.g., warning tone and/or synthesized voice message that warns the user that a cooling air flow path blockage condition exists).

Returning to FIG. 5B, if it is determined that the current absolute air pressure value is high in step 556, then methodology 550 proceeds to step 558 where the current absolute value of real time sensed pressure may be compared to a predetermined critical absolute pressure threshold value that is stored, for example, in a thermal table maintained in system BIOS stored on non-volatile memory 130 or other suitable data storage of system 100, e.g., such as shown in previously-described FIG. 2. Table 2 below illustrates an exemplary thermal table provided for purposes of illustration only that includes example values of high inlet pressure, critical absolute pressure threshold and maximum fan operation for use in methodology 550 described herein.

Still referring to FIG. 5B, if absolute value of real time sensed pressure from pressure sensor 173 does not meet the predetermined critical absolute pressure threshold value in step 560, then methodology 550 proceeds to steps 568 and 552 in a manner as described above. However, if absolute value of real time sensed pressure from pressure sensor 173 is determined to meet or exceeds the predetermined critical absolute pressure threshold value in step 560, then methodology 550 proceeds to step 562 where control signals 181 are provided to fan control circuitry to incrementally increase the rotation speed (or air flow rate) of cooling fan 110, e.g., by 200 RPM or other suitable greater or lesser RPM. Methodology 550 then proceeds to step 564 where it is determined whether the cooling fan 110 is already set at its maximum speed (or RPM). If not, then methodology 550 proceeds to steps 568 and 552 in a manner as described above. However if it is determined in step 564 that the cooling fan 110 is already set at its maximum speed, then methodology 550 proceeds to step 566 where a flag is set in EC Bios (e.g., stored on system memory 130 or dedicated non-volatile memory coupled to EC 180) to indicate that cooling air flow is impeded (e.g., due to debris accumulation within the cooling air flow path of chassis enclosure 105).

Methodology 550 proceeds from step 566 to step 568, where it is determined that the impeded air flow flag was set in EC Bios in steps 566. Methodology 550 then proceeds from step 568 to step 570, where an error message is displayed to a user (e.g., on system display 140) that instructs the user to reboot the system and OS, which then occurs in step 572 under control of the user. Once reboot is initiated, pre-boot diagnostics are executed in step 574 where the impeded air flow flag is detected by impeded air flow detection algorithm 138, which responds by providing a F/R control signal 181 to fan circuitry 115 to cause temporary reversal (e.g., for about 10 seconds or other suitable greater or lesser temporary time period) of cooling fan direction in step 576 (e.g., via general purpose input/output signals "GPIO"). Fan speed may also be increased (e.g., to maximum fan rotation speed) in step 578 for the duration of the temporary reversed rotation time period to facilitate debris removal action, e.g., as illustrated in FIGS. 2B and 3B. After completion of the temporary cleaning period, an appropriate F/R control signal 181 is provided to return the cooling fan to its normal rotation direction in step 580 which runs at a continuous set rotation speed (e.g., normal operating speed at current internal chassis temperature) in step 582. Real time absolute air pressure value from pressure sensor 173 is then sensed again in step 584 to determine in step 586 if it still meets or exceeds the predefined critical absolute pressure threshold value previously described. If so, then methodology 550 returns to step 576 and repeats as before. However, if real time absolute air pressure value is found in step 586 to have dropped below the critical absolute pressure threshold value, then methodology 550 proceeds to step 588 where the impeded air flow flag is cleared from EC Bios memory, and the system 100 continues booting and returns to normal active state of step 552 where methodology 550 repeats as before.

It will be understood that the steps of methodologies 500 and 550 are exemplary only, and that any combination of fewer, additional and/or alternative steps may be employed that are suitable for temporarily reversing cooling air flow direction for purposes of debris removal. For example, with regard to FIG. 5B, it will be understood that in another embodiment step 570 may alternatively display a message that instructs the user to shut down system 100 and have it serviced by a qualified technician, in which case steps 572 through 588 may be performed as part of a diagnostic routine that is available to (and executed by) a technician, e.g., rather than automatically during the next system boot. In yet another embodiment, a counter in EC BIOS may be employed to count the number of times that step 586 returns to step 576, i.e., without remedying the impeded air flow condition. In such an embodiment, the system may be shut down by impeded air flow detection algorithm 138 (or other diagnostic algorithm) without completing the system reboot if the counter reaches a predefined number of unsuccessful debris removal attempts (e.g., five attempts or other greater or lesser number of attempts), and an error message displayed to instruct the user that the system 100 needs to be serviced by a qualified technician.

It will understood that one or more of the tasks, functions, or methodologies described herein (e.g., including those described herein for components 115, 132, 135, 150, 159, 180, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed on a processing device in the form of a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodologies disclosed herein. It will also be understood that one or more steps of the present methodologies may be employed in one or more code segments of the computer program. For example, a code segment executed by the information handling system may include one or more steps of the disclosed methodologies. It will be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed adapters, systems and methods may be utilized in various combinations and/or independently. Thus the invention is not limited to only those combinations shown herein, but rather may include other combinations.

What is claimed is:

1. An information handling system, comprising:

a chassis enclosure having at least one inlet defined in the chassis enclosure and at least one outlet defined in the chassis enclosure;

at least one heat-generating component disposed within the chassis enclosure;

at least one cooling fan disposed within the chassis enclosure, the cooling fan configured to draw in air from outside the chassis enclosure through the inlet into the interior of the chassis enclosure to move the air in a first direction through a first air flow path within the chassis enclosure to cool the heat-generating component and to expel the air from the interior of the chassis enclosure through the outlet, and to selectably draw in air from outside the chassis enclosure through the outlet into the interior of the chassis enclosure to move the air in a second direction through a second air flow path within the chassis enclosure to expel the cooling air from the interior of the chassis enclosure through the inlet;

at least one pressure sensor disposed within the first air flow path within the chassis enclosure; and at least one processing device coupled to the pressure sensor to monitor the real time air pressure within the first air flow path and coupled to the cooling fan to selectably control an operation of the cooling fan to change the direction the cooling fan moves the air through the chassis enclosure from the first direction to the second direction based on the monitored air pressure within the first air flow path.

2. The information handling system of claim 1, where the processing device is programmed to compare an absolute value of the real time monitored air pressure within the first air flow path to a predefined absolute pressure threshold value while the cooling fan is moving air in the first direction through the first air flow path; and to control the cooling fan to move air in the second direction through the second air flow path only if the absolute value of the real time monitored air pressure within the first air flow path meets or exceeds the predefined absolute pressure threshold value.

3. The information handling system of claim 1, where the processing device is programmed to compare an absolute value of the real time monitored air pressure within the first air flow path to a predefined absolute pressure threshold value while the cooling fan is moving air in the first direction through the first air flow path; and to provide an alert indication to a user of the information handling system only if the absolute value of the real time monitored air pressure within the first air flow path meets or exceeds the predefined absolute pressure threshold value.

4. The information handling system of claim 1, comprising at least two pressure sensors disposed at different respective locations within the first air flow path within the chassis enclosure; where the processing device is programmed to compare an absolute value of the difference in real time monitored air pressure at the two different pressure sensors to a predefined absolute pressure difference threshold value while the cooling fan is moving air in the first direction; and to take at least one of the following actions only if the absolute value of the difference in real time monitored air pressure meets or exceeds the predefined absolute pressure difference threshold value:

provide an alert indication to a user of the information handling system; or control the cooling fan to move air in the second direction through the second air flow path.

5. The information handling system of claim 1, where the pressure sensor is disposed within the first air flow path within the chassis enclosure between the cooling fan and the at least one outlet defined in the chassis enclosure.

6. The information handling system of claim 1, where the pressure sensor is disposed within the first air flow path within the chassis enclosure between the cooling fan and the at least one inlet defined in the chassis enclosure.

7. The information handling system of claim 1, where the processing device is programmed to control the cooling fan to move air in the second direction through the second air flow path to dislodge at least a portion of debris that have previously accumulated in one or more structures positioned in the first air flow path during movement of air in the first direction through the chassis enclosure.

8. The information handling system of claim 1, where at least a portion of the first air flow path and the second air flow path are the same.

9. The information handling system of claim 1, where the processing device is programmed to:

control the cooling fan to continue to move air in the first direction through the first air flow path after detecting that the absolute value of the real time monitored air pressure within the first air flow path meets or exceeds the predefined absolute pressure threshold value;

then control the cooling fan to temporarily move air in the second direction through the second air flow path only at the occurrence of the next system boot; and then control the cooling fan to again move air in the first direction through the first air flow path after temporarily moving air in the second direction through the second air flow path.

10. The information handling system of claim 1, where the processing device is programmed to:

control the cooling fan to continue to move air in the first direction through the first air flow path after detecting that the absolute value of the real time monitored air pressure within the first air flow path meets or exceeds the predefined absolute pressure threshold value; and then control the cooling fan to temporarily move air in the second direction through the second air flow path only upon execution of a diagnostic routine.

11. The information handling system of claim 1, where the chassis enclosure is a base component of a notebook computer.

12. A method, comprising:

controlling at least one cooling fan disposed within a chassis enclosure of an information handling system to draw in air from outside the chassis enclosure through at least one inlet defined in the chassis enclosure into the interior of the chassis enclosure to move the air in a first direction through a first air flow path within the chassis enclosure to cool at least one heat-generating component within the chassis enclosure and to expel the air from the interior of the chassis enclosure through at least one outlet defined in the chassis enclosure;

monitoring real time air pressure within the first air flow path while the cooling fan is moving the air in the first direction through the first air flow path within the chassis enclosure; and controlling the at least one cooling fan based on the monitored air pressure within the first air flow path to change the direction that air moves though the chassis enclosure from the first direction to a different and second direction so as to draw in air from outside the chassis enclosure through the outlet into the interior of the chassis enclosure and move the air in a second direction through a second air flow path within the chassis enclosure to expel the cooling air from the interior of the chassis enclosure through the inlet.

13. The method of claim 12, further comprising comparing an absolute value of the real time monitored air pressure within the first air flow path to a predefined absolute pressure threshold value while the cooling fan is moving air in the first direction through the first air flow path; and controlling the cooling fan to move air in the second direction through the second air flow path only if the absolute value of the real time monitored air pressure within the first air flow path meets or exceeds the predefined absolute pressure threshold value.

14. The method of claim 12, further comprising comparing an absolute value of the real time monitored air pressure within the first air flow path to a predefined absolute pressure threshold value while the cooling fan is moving air in the first direction through the first air flow path; and to providing an alert indication to a user of the information handling system only if the absolute value of the real time monitored air pressure within the first air flow path meets or exceeds the predefined absolute pressure threshold value.

15. The method of claim 12, further comprising monitoring real time air pressure within the first air flow path at two or more locations disposed at different respective locations within the first air flow path within the chassis enclosure; comparing an absolute value of the difference in real time monitored air pressure at the two different locations to a predefined absolute pressure difference threshold value while the cooling fan is moving air in the first direction; and taking at least one of the following actions only if the absolute value of the difference in real time monitored air pressure meets or exceeds the predefined absolute pressure difference threshold value:

providing an alert indication to a user of the information handling system; or controlling the cooling fan to change the direction that air moves though the chassis enclosure from the first direction to the second direction through the second air flow path.

16. The method of claim 12, were the step of monitoring real time air pressure within the first air flow path while the cooling fan is moving the air in the first direction comprises monitoring the real time air pressure at a location in the first air flow path within the chassis enclosure between the cooling fan and the at least one outlet defined in the chassis enclosure.

17. The method of claim 12, were the step of monitoring real time air pressure within the first air flow path while the cooling fan is moving the air in the first direction comprises monitoring the real time air pressure at a location in the first air flow path within the chassis enclosure between the at least one inlet and the cooling fan.

18. The method of claim 12, further comprising controlling the cooling fan to temporarily move air in the second direction through the second air flow path to dislodge at least a portion of debris that have previously accumulated in one or more structures positioned in the first air flow path during movement of air in the first direction through the chassis enclosure.

19. The method of claim 12, further comprising controlling the cooling fan to continue to move air in the first direction through the first air flow path after detecting that the absolute value of the real time monitored air pressure within the first air flow path meets or exceeds the predefined absolute pressure threshold value; and then controlling the cooling fan to temporarily move air in the second direction through the second air flow path only at the occurrence of at least one of the next system boot, or execution of a diagnostic routine; and then controlling the cooling fan to again move air in the first direction through the first air flow path after temporarily moving air in the second direction through the second air flow path.

20. The method of claim 12, where the chassis enclosure is a base component of a notebook computer.

* * * * *